US010557615B2

(12) United States Patent
Vogt et al.

(10) Patent No.: US 10,557,615 B2
(45) Date of Patent: Feb. 11, 2020

(54) CONVERSION DEVICE WITH STACKED CONDUCTOR STRUCTURE

(71) Applicant: OSRAM GmbH, Munich (DE)

(72) Inventors: Peter Vogt, Kelheim (DE); Richard Scheicher, Thierhaupten (DE); Sergey Kudaev, Regensburg (DE); Robert Gareis, Lappersdorf (DE); Moritz Engl, Regensburg (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 16/226,680

(22) Filed: Dec. 20, 2018

(65) Prior Publication Data

US 2019/0203911 A1 Jul. 4, 2019

(30) Foreign Application Priority Data

Jan. 2, 2018 (DE) ........................ 10 2018 200 023

(51) Int. Cl.

*H01L 27/15* (2006.01)
*H01L 33/00* (2010.01)
*F21V 9/30* (2018.01)

(52) U.S. Cl.

CPC ...................................... *F21V 9/30* (2018.02)

(58) Field of Classification Search

CPC .... F21V 9/30; F21Y 2115/30; F21Y 2115/10; H01S 5/005; H01S 5/06825; H01S 5/0683; Y10T 29/49826

See application file for complete search history.

(56) References Cited

U.S. PATENT DOCUMENTS

| | | | | |
|---|---|---|---|---|
| 6,936,927 B2 * | 8/2005 | Igarashi | H01L 23/49822 | 257/700 |
| 8,410,500 B2 * | 4/2013 | Sormani | H01L 33/505 | 257/98 |
| 2004/0145308 A1 * | 7/2004 | Rossner | C04B 35/44 | 313/512 |
| 2010/0012955 A1 * | 1/2010 | Sorg | H01L 24/24 | 257/88 |
| 2010/0072486 A1 * | 3/2010 | Offermans | H01L 33/505 | 257/84 |
| 2014/0009952 A1 * | 1/2014 | Nomura | H01S 5/00 | 362/509 |
| 2016/0069539 A1 * | 3/2016 | Grotsch | H01L 33/60 | 362/343 |

* cited by examiner

*Primary Examiner* — Tracie Y Green

(57) ABSTRACT

A conversion device includes a carrier body, a conversion body, which is secured on the carrier body, for converting electromagnetic radiation, a conduction track, which is applied on the conversion body, for monitoring the conversion body, and a contact element applied on the carrier body. The contact element has a first layer construction including at least a first contact layer and a second contact layer including mutually different materials. The conduction track has a second layer construction including at least a first conduction layer and a second conduction layer comprising mutually different materials. The contact element is electrically connected to the conduction track. At least one of the first conduction layer or the second conduction layer are electrically conductive and the thickness of said conductive layers is chosen such that an electrical impedance of the conduction track lies in a predetermined range.

20 Claims, 2 Drawing Sheets

CONVERSION DEVICE WITH STACKED CONDUCTOR STRUCTURE

CROSS-REFERENCE TO RELATED APPLICATION

This application claims priority to German Patent Application Serial No. 10 2018 200 023.9, which was filed Jan. 2, 2018, and is incorporated herein by reference in its entirety.

TECHNICAL FIELD

Various embodiments relate generally to a conversion device including a carrier body, a conversion body, which is secured on the carrier body, and a conduction track, which is applied on the conversion body, for monitoring the conversion body. Furthermore, the various embodiments relate to a measuring instrument including such a conversion device, and also a lighting arrangement, the light source of which illuminates the conversion device.

BACKGROUND

It is known to radiate primary light of a predefined primary light wavelength (e.g. blue light) onto a wavelength-converting ceramic body, where the primary light is converted at least partly into light of longer wavelength (e.g. into yellow light) and is re-emitted. The ceramic body can consist of rare-earth-doped ceramic having a garnet structure and typically has a laminar shape. It is usually irradiated centrally with the primary light. If the primary light is laser light and if the ceramic body is spaced apart from the laser that generates the primary light, this is also referred to as an LARP ("Laser Activated Remote Phosphor") arrangement, with a miniaturized configuration being referred to as a μLARP arrangement. In this case, the German word "Phosphor" should not be understood to mean the element phosphorus, which is the same word in German, but rather generally the phosphor of the ceramic body or conversion element.

Upon the irradiation of the ceramic body, a significant local temperature increase occurs at the irradiation surface and can lead to generation of thermally induced stresses in the ceramic body and possibly to damage to the wavelength-converting ceramic body as a result of cracking. The risk of cracking can increase over time as a result of the primary light being repeatedly switched on and off, since a thermally induced alternating load associated therewith can lead to increased stress formation in the ceramic body.

Cracks in the wavelength-converting ceramic body have been able to be identified hitherto by means of complex optical analysis of the light emanating from the ceramic body.

A conventional conversion body includes a main body composed of wavelength-converting phosphor, which has an irradiation surface provided for irradiation with primary light, and at least one electrically conductive conduction track fitted on the main body outside the irradiation surface. A conversion device includes at least one conversion body and an evaluation device connected to the at least one conduction track, wherein the evaluation device is configured to ascertain a crack in the main body on the basis of a change in an electrical property of at least one conduction track. The conduction track consists of Al or a tungsten wire.

A critical aspect in the case of conversion devices is the configuration of the conduction track with regard to its evaluation. Furthermore, the contacting of the conduction track within the conversion device and toward the outside is also a technological challenge. By way of example, there are problems in the case of metallization since the typical contact elements on the carrier body lie for example 70 to 100 μm below the conduction track situated on the conversion body.

SUMMARY

A conversion device includes a carrier body, a conversion body, which is secured on the carrier body, for converting electromagnetic radiation, a conduction track, which is applied on the conversion body, for monitoring the conversion body, and a contact element applied on the carrier body. The contact element has a first layer construction including at least a first contact layer and a second contact layer including mutually different materials. The conduction track has a second layer construction including at least a first conduction layer and a second conduction layer comprising mutually different materials. The contact element is electrically connected to the conduction track. At least one of the first conduction layer or the second conduction layer are electrically conductive and the thickness of said conductive layers is chosen such that an electrical impedance of the conduction track lies in a predetermined range.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
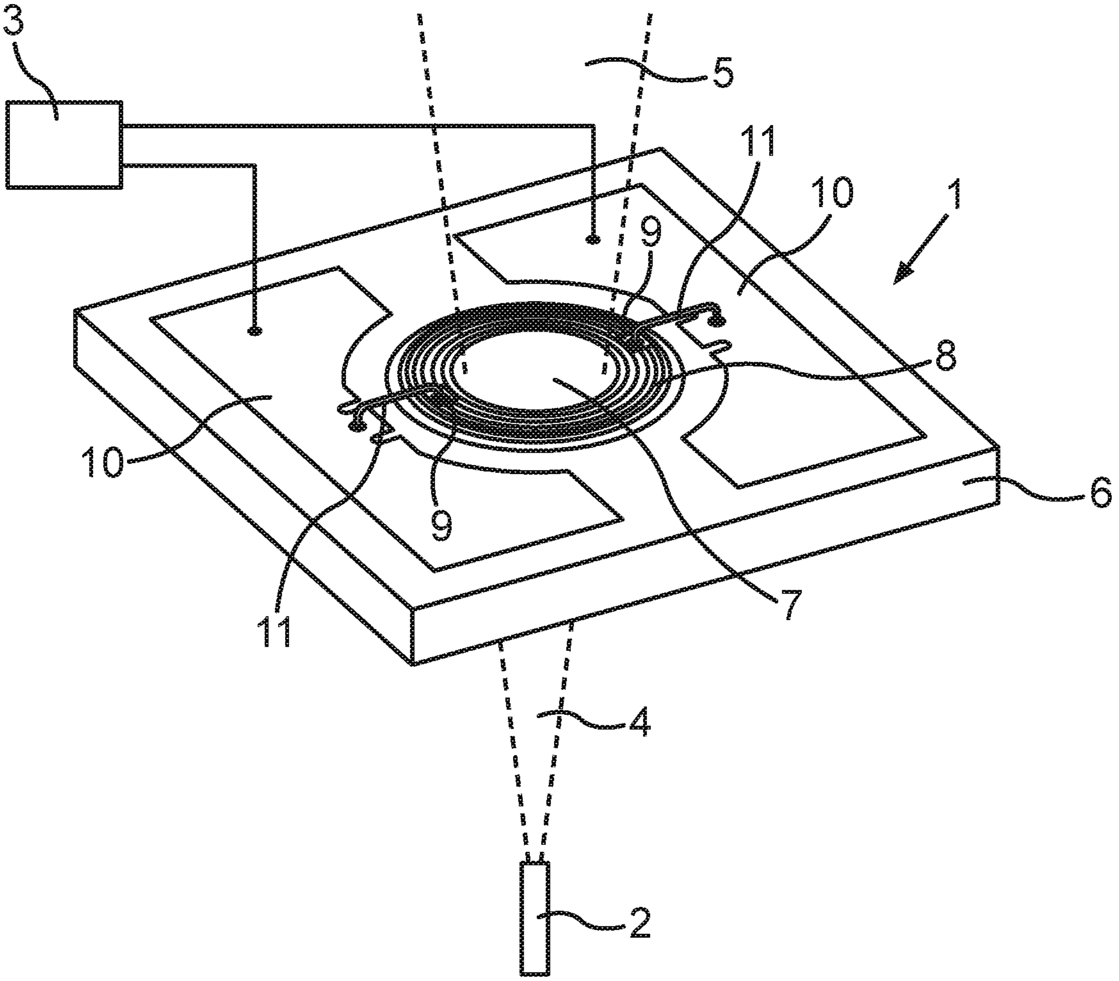
FIG. 1 shows a schematic view of a lighting arrangement including a conversion device according to various embodiments.

The following detailed description refers to the accompanying drawings that show, by way of illustration, specific details and embodiments in which the invention may be practiced.

Various embodiments propose a conversion device whose conduction track for monitoring the conversion body enables more reliable monitoring of the conversion body and more reliable production of the conversion device. Furthermore, a measuring instrument including such a conversion device and also a lighting arrangement including such a conversion device are provided.

Accordingly, provision is made of a conversion device including:

- a carrier body,
- a conversion body, which is secured on the carrier body, for converting electromagnetic radiation,
- a conduction track, which is applied on the conversion body, for monitoring the conversion body, and further including

- a contact element applied on the carrier body, wherein
- the contact element has a first layer construction including at least a first contact layer and a second contact layer including mutually different materials, the conduction track has a second layer construction including at least a first conduction layer and a second conduction layer including mutually different materials, the contact element is electrically connected to the conduction track, and the first conduction layer and/or second conduction layer are/is electrically conductive and the thickness of said conductive layer/layers is chosen (given a predefined width of the individual layer/layers) such that an electrical impedance of the conduction track lies in a predetermined range.

The conversion device thus has a carrier body as a basis for electrical and optically active components. The carrier body itself can be transparent or nontransparent. The transparency relates at least to a range of visible light, in particular a spectral range of the primary light. A conversion device that is transparent overall can be realized with a transparent carrier body. By contrast, an opaque carrier body, for example a highly reflective metallic carrier body, can be used for a reflective conversion device.

A conversion body is secured on the carrier body. Said conversion body serves to convert incident light. This means that it converts the wavelength of the incident light at least partly into light of longer wavelength. The temperature of the conversion body typically rises during the irradiation and conversion. This can lead to the cracking mentioned in the introduction on account of thermal stresses. Cracks of this type can have the effect that highly energetic primary light penetrates through the conversion body in an unimpeded manner or at least the conversion ratio between primary radiation and secondary radiation (output radiation) changes in an undesired manner. This can result in hazardous situations, which it is necessary to prevent.

For monitoring the functionality of the conversion body, a conduction track is applied thereon. Said conduction track is electrically conductive and extends typically at the edge of the conversion body. The conduction track often extends around an irradiation surface on which the conversion body is irradiated with the primary light. Usually the conversion body is configured with a laminar shape (in particular as round) and the irradiation surface is situated on a flat side of said laminar conversion body. Accordingly, the conduction track generally extends along the entire edge of the flat side having the irradiation surface. In one specific configuration, the conduction track extends in a meandering fashion multiply and in each case almost completely around the irradiation surface along the edge of the conversion body. If appropriate, besides the aforesaid conduction track, the conversion device also has at least one further conduction track separated therefrom, the latter being evaluated if appropriate separately or jointly.

There is applied on the carrier body a contact element, generally at least two contact elements. The contact element or contact elements serve(s) to be able to contact the conversion device externally with an evaluation device. A contact element of this type is generally configured in planar fashion. The conversion device can thus be reliably contacted by means of wire bonding, for example. Furthermore, it is necessary for the respective contact element to be electrically connected to the conduction track or one or more of the conduction tracks. This electrical connection between contact element and conduction track is critical to a certain extent since the conduction track generally lies approximately 70 to 100 μm higher on the conversion body than the contact element on the carrier body. In order to surmount this step, a so-called edge metallization can be used. In this case, by way of example, the flat side of the conversion body is sputtered just like the edge side or the circumferential surface. However, said edge metallization requires a very high precision with regard to the layer thicknesses both on the flat side and on the edge side of the conversion body. This height difference at the conversion body can be surmounted significantly more easily by wire bonding.

Wire bonding, wherein a wire is fitted to the relevant element for example by friction welding, makes particular requirements of the contact area to be used. By way of example, the material and the material thickness or the material construction must be suitable for wire bonding or friction welding.

For the evaluation of the conduction track it is necessary for the electrical properties thereof to be within predefined bounds. In various embodiments, the electrical impedance of the conduction track should lie in a predetermined range in order that a given measuring instrument or a given evaluation device can directly and reliably detect the state of the conduction track on the basis of the electrical impedance thereof. It has been found that these different requirements made of the conduction track and/or the contact element can be reconciled with one another only with difficulty. However, the inventors have discovered that a multilayered construction having layer thicknesses and layer materials finely coordinated with one another is able to handle the different requirements made of the conduction track and/or the contact element. Particular difficulties in finding a suitable layer stack arise from the following technical requirements, which often occur simultaneously:

adhesion on ceramic substrate and simultaneous bondability, the highest possible electrical impedance at variance technically with the thickest possible layers for reliable wire bonding (standard layer thicknesses of the substrate in the case of gold bonding normally >1 μm), Kirkendall effect and associated intermetallic diffusion in thin-film stacks in the temperature profile of the application vis-à-vis mechanical long-term stability of the bond connection and of the layer stack, long-term stability of the electrical impedance value in the application, resistance to chemical influences/corrosion in the application, and resistance of the metallization to electromigration effects or whisker formation. In this regard, by way of example, the contact element has a first layer construction including at least a first contact layer and a second contact layer composed of different materials. Here and also in the further course of the document it should be assumed that a layer in a layer stack consists of a different material than the respective adjoining layers. That is to say that a change in the material composition thus takes place at each layer boundary. Furthermore, here and also in the rest of the document it should be assumed that a layer construction is given to a layer stack including a first layer, a second layer, if appropriate a third layer and so on. The numbering thus corresponds to the actual layer sequence, unless some other layer sequence is explicitly mentioned. Furthermore, here and also in the rest of the document it should generally be assumed that each layer in a layer construction or a layer stack directly adjoins a neighboring layer. In this regard, by way of example, a second layer directly adjoins a first layer and a third layer. Moreover, it should be pointed out that not every layer must be electrically conductive. In this regard, by way of example, one conduction layer of the conduction track can be electrically conductive, while another conduction layer of the conduction track is electrically insulating. The same applies to the contact layers of the contact element.

In the present case, therefore, the contact element has a first layer construction including at least a first contact layer and a second contact layer including mutually different materials. The contact element thus has for example an aluminum layer and a silicon oxide layer. The Al layer can be led by edge metallization over the edge of the conversion body to the conduction track. The silicon oxide layer should be applied on the Al layer in order to ensure an electrical insulation. It goes without saying that a third layer, in particular a further silicon oxide layer, can be situated below the Al layer as well, in order for example to realize a low-stress, flexible connection to the conversion body or carrier body.

However, the first contact layer can also be an Au layer, for example, which is suitable for wire bonding. The second layer below the Au layer could be a Pd layer having sufficiently elastic properties in order to enable wire bonding. Below the Pd layer, there could be situated as third layer a Ti layer or Pt layer, which can serve as an adhesion promoter to the conversion body or carrier body.

Analogously to the contact element, the conduction track has a second layer construction including at least a first conduction layer and a second conduction layer including mutually different materials. In this case, the same principles as for the contact layers mentioned above apply to the conduction layers. Furthermore, with regard to fabrication it can be expedient if the first contact layer and the first conduction layer are identical, just like the second contact layer and the second conduction layer can be mutually identical. As a result, both the conversion body and the carrier body can obtain the first layers in a single process step (e.g. coating by means of sputtering or vapor deposition technologies in a mask process) and likewise the second layers in a single process step. On the other hand, the individual layers of the two layer constructions can also be different in any desired manner. As a result, it is possible to achieve a high variation diversity of layers and a corresponding optimization of the individual components.

The conduction track may be evaluated with regard to its electrical impedance. Therefore, the one or the plurality of electrically conductive conduction layers is/are configured geometrically and/or with regard to the material thereof such that the electrical impedance of the conduction track lies in a defined range, which can be predefined e.g. by a measuring instrument. If, by way of example, the conversion body then acquires a crack on account of thermal fluctuations, said crack typically extends through the conduction track, such that the impedance thereof generally becomes very high. This defect can thus readily be determined by a measuring instrument on the basis of the change in impedance. If the sensor system loses its sensing ability for example as a result of defective bridging then this damage can be detected for example by virtue of an excessively low impedance of the conduction track. Therefore, the impedance of the conduction track during proper operation should lie between a minimum value and a maximum value.

In one configuration of the conversion device, it is provided that all the layers of the layer constructions in each case have a constant layer thickness which is a maximum of 1000 nm and e.g. lies below 500 nm and e.g. below 300 nm. In order to enable wire bonding on contact layers, layer thicknesses of at least 1000 nm are usually required. However, the layer construction of the contact element and of the conduction track makes it possible for an individual layer also to be thinner in a straightforward way. In this regard, by way of example, the layer thickness of each layer of a layer construction can lie between 10 nm and 300 nm or between 60 nm and 200 nm. Independently of the layer thickness, a line width of 50 μm is typically chosen for the conduction track. In the case of present-day technologies, the lower limit for the line width is approximately in the single-digit μm range. The upper limit of the line width is determined by the minimum impedance value and is approximately 250 μm. On account of the resistivity, a corresponding electrical impedance arises in the case of a predefined material for a specific layer thickness. Since the impedance would generally be too low for the desired evaluation in the case of a customary layer thickness of 1 μm, here on account of the layer construction it may be possible to choose a conductive layer whose layer thickness is correspondingly thinner, as a result of which the desired electrical impedance can be attained. In various embodiments, it has proved to be expedient if layer thicknesses of less than 300 nm are chosen and are specifically a maximum of 200 nm.

In various embodiments, provision can be made for the first layer construction of the contact element to have a third contact layer including a different material than the second contact layer, thus resulting in the layer sequence of first, second and third contact layers. The contact element thus has a layer stack in which three different contact layers each including different materials are arranged one directly above another. These three different materials can ensure a wide variety of functions. One of these functions would be the electrical conduction in order to produce the desired electrical impedance. A further function of one of the layers can consist in electrical insulation. Further functions for individual layers would be diffusion protection and adhesion promotion. In special cases, it is also possible for more than three layers to be stacked one above another, such as, for instance, an Au layer, a Pd layer, a Ti layer and an Al layer.

In a further configuration of the conversion device, the second layer construction of the conduction track has a third conduction layer including a different material than the second conduction layer, thus resulting in the layer sequence of first, second and third conduction layers. In this case, therefore, the layer stack of the conduction track has at least three layers one directly above another. If appropriate, however, a further layer can be provided here, too, above or below the layer stack or between two individual layers of said layer stack. A correspondingly comprehensive functionality of the entire layer construction can once again be achieved by virtue of the three different layers. The individual functions substantially correspond to those of the layer construction of the contact element.

In a further configuration, it is provided that the first contact layer and/or the first conduction layer consist(s) of silicon oxide. In the present document, the first layer generally constitutes the topmost layer of a layer stack on the carrier body or the conversion body. In other words, if the first layer here is silicon oxide, this means that the conduction track or the contact element in this state is electrically insulated toward the top.

In this case, it is expedient if the first contact layer and/or the first conduction layer have/has a thickness in the range of 10 to 20 nm. By way of example, an expedient insulation layer composed of silicon oxide has a layer thickness of 15 nm. Such a layer thickness generally affords sufficient electrical and/or mechanical protection.

In a further configuration, it is provided that the second contact layer and/or the second conduction layer are/is predominantly formed from one of the elements Ni, Pt, Cu, Ta or Al. These metals are suitable alongside Au for the production of an electrically conductive layer. With the latter it is possible not only to produce the desired contacting but also to set the desired impedance accordingly. In principle, it is also possible, of course, to use other metals and/or alloys to realize the second contact layer and/or second conduction layer.

In the case of said electrically conductive layer, provision can be made for it to have a thickness in the range of 100 to 200 nm. In this way, by way of example, given a layer width of 50 μm, a layer thickness of 150 nm and a conductor track length of from a plurality of centimeters to tens of centimeters for example for Al, it is possible to achieve a reasonably evaluatable impedance value.

In various embodiments, the third contact layer and/or the third conduction layer consist(s) of silicon oxide (SiOx). The third layer thus constitutes for example an insulation layer on the carrier body or on the conversion body. This electrical insulation layer can serve for protecting the conductive layer (e.g. second layer) or else only for adhesion promotion or have other electrical insulation purposes. In various embodiments, it is thus possible to realize a layer stack of silicon oxide-Al-silicon oxide (SiOx-Al-SiOx), for example.

In this case, the third contact layer and/or the third conduction layer can have a thickness in the range of 5 to 15 nm. In various embodiments, the thickness can be 10 nm, for example. Such a thin silicon oxide layer in the present application generally ensures sufficient insulation. In the case of other insulation materials, the thickness of the third layer can also be larger or smaller.

In a further configuration, the first contact layer and/or the first conduction layer consist(s) of Au. A layer stack which is constructed in this way and in which the topmost or first layer is formed from Au is particularly well suited to wire bonding processes. In various embodiments, Au wire can be reliably bonded onto the Au layer by friction welding. In principle, however, the first contact layer and/or the first conduction layer can also consist of a different material, which, however, may then be adapted to the material of the wire during wire bonding. In various embodiments, the material of the contact layer and/or of the conduction layer must not consist of pure Au. Rather, alloyed or doped Au can also be involved, particularly if the wire during bonding also consists of a corresponding material. Furthermore, the wire during wire bonding can also consist for example of Cu or Al (if appropriate with silicon portion). The material of the first contact layer and/or of the first conduction layer should be chosen accordingly.

Moreover, provision can be made for the first contact layer and/or the first conduction layer to have a thickness in the range of 50 to 250 nm. This layer thickness for the conductive layer generally suffices to ensure a sufficient electrical conduction or to realize the desired impedance, for example, for the customary geometries. In this regard, it may be provided that an Au layer as the first contact layer and/or the first conduction layer has a layer thickness of 100 nm.

In a further configuration, the second contact layer and/or the second conduction layer predominantly include(s) one of the elements Pt, Pd, Ni or V. A layer of this type has the advantage that it can introduce an additional specific functionality. In this regard, by way of example, Pt or Pd is suitable for introducing a certain elasticity into the stack in order to avoid damage during wire bonding. By contrast, alloys of nickel or vanadium and in particular nickel-vanadium have the positive property of a diffusion barrier. Such a diffusion barrier can be used for example between Au and Al.

The second contact layer and/or the second conduction layer can have a thickness in the range of 50 to 250 nm. A layer thickness of 150 nm, for example, is suitable in the case of Al in order to be able to implement even thin and nevertheless reliable edge metallizations. However, the second contact and/or conduction layer could also be for example a layer of Pd or platinum having a thickness of 100 nm or 200 nm. Such a platinum or Pd layer promotes wire bonding for example for an overlying Au layer of e.g. 60 nm or 100 nm.

In accordance with a further configuration, provision can be made for a third contact layer and/or a third conduction layer to consist of or include one of the elements Ti or Al. Ti and Al are suitable e.g. as adhesion promoters between a metal layer such as Pd, for instance, and the carrier body, which is formed from sapphire, for example. If appropriate, Ti is also used as third contact and/or conduction layer and an Al layer is used as fourth layer, said Al layer producing the direct contact with the carrier body (e.g. sapphire).

The third contact layer and/or the third conduction layer can have a thickness in the range of 50 to 100 nm. Specifically, a Ti layer having a thickness of 60 nm can be involved, for example. This small thickness suffices to ensure the necessary adhesion promotion.

In a further configuration, the carrier body is transparent at least to the electromagnetic radiation (primary light) to be converted. It is thereby possible to realize a transmissive conversion device. Light to be at least partly converted can thus be radiated directly into the carrier body and subsequently radiates through the conversion body. The metallizations at the edge of the converter generally only slightly impair the radiation transmission behavior, since the majority of the light is passed centrally through the generally round converter lamina.

In a further embodiment, provision is made for the first and/or second layer construction to have a diffusion barrier with respect to Au. Such a diffusion barrier or layer can be a nickel-vanadium layer. It ensures that for example no Au atoms of a first layer penetrate into an Al layer as third layer. In this case, the second contact and/or conduction layer would be a diffusion barrier.

The diffusion barrier may include the elements Cr, Al, Pd, Pt, Ni, Cu, Mo, Nb or W and have a thickness in the range of 100 to 500 nm. In this regard, specifically a diffusion barrier composed of NiV having a layer thickness of 300 nm can be used.

Furthermore, provision can be made for the conduction track to have a thermistor. Such a thermistor can be for example a PTC semiconductor or an NTC semiconductor having a positive or negative temperature coefficient. Within a conversion ceramic there are positive nonlinear feedback effects between the laser radiation power and the generated temperature in the ceramic. These can lead to a so-called "drift" in temperature in the event of a linear increase in the pump power (thermal quenching). As a result of a nonlinear response characteristic of the impedance value of the metallization, the sensitivity of the sensor system with regard to thermal effects is greatly increased by virtue of the drift in temperature leading to a more than proportional rise or fall in the impedance value. This allows fault states to be identified before, under certain circumstances, a critical, thermally induced voltage level with the consequence of cracks in the ceramic arises. In the case of a PTC semiconductor, this can involve for example a PTC thermistor on the basis of doped silicon. Barium titanate can likewise be used, which is sputterable, for example. Ba(1-x)Sr(x)TiO3, for example, is likewise suitable as a PTC semiconductor.

In a further configuration of the conversion device, a layer of the contact element and/or of the conduction track can be transparent at least to the electromagnetic radiation to be converted, e.g. for a range of visible light (primary light). Layers that are transparent in this way can be produced for example from indium tin oxide (abbreviated to ITO). By way of example, a layer of Pd, Pt or Au can be applied on the semiconducting indium tin oxide, at least in sections. As an alternative to ITO, it is also possible to use colorless zinc oxide (ZnO) in order for example to obtain a rough surface during sputtering, the light being scattered at said surface in order for example to achieve a higher efficiency of the light emergence.

The electrical impedance of the conduction track is taken into consideration for monitoring the conversion body. The electrical impedance can be an ohmic resistance, an inductive reactance or a capacitive reactance. Thus, from the complex impedance, the reactance (imaginary part) and/or the effective resistance (real part) can be taken into consideration. The geometry of the corresponding conduction layer and/or of the conduction track can then be coordinated with regard to the reactance and/or effective resistance. Depending on the sign of the reactance, an inductive or capacitive portion of the electrical impedance is accordingly involved.

Furthermore, a measuring instrument having one of the conversion devices mentioned above can be provided, wherein the electrical impedance of the conduction track is adapted to the measuring instrument. In this case, the measuring instrument can have a specific predefined measurement range for the electrical impedance. The geometry of the conduction track of the conversion device is then correspondingly adapted in order to be able to optimally utilize the measuring instrument. In this regard, by way of example, this adaptation to the measuring instrument makes it possible to predefine the range in which the value or values of the electrical impedance may vary under predefined operating conditions. Accordingly, lower and upper limits can be defined. If a measurement signal then exceeds or falls below the predefined limit or the predefined limits, then a corresponding defect of the conversion device can be indicated.

Furthermore, a lighting arrangement may include a conversion device mentioned above and the measuring instrument mentioned above, wherein the lighting arrangement likewise contains a light source for illuminating the conversion device. In the case of this lighting arrangement, the conversion device illuminated by the light source can thus be monitored with the aid of the measuring instrument.

FIG. 1 shows a lighting arrangement including a conversion device 1, a light source 2 and a measuring instrument 3. The light source 2 is a laser light source, for example. Said light source 2 emits primary light 4 having a predefined primary light wavelength (e.g. blue light). Said primary light 4 impinges on the conversion device 1, which converts the primary light 2 at least partly into light 5 of longer wavelength (e.g. into yellow light). Together with the portion of converted light of the primary light 4, this results in a light 5 (secondary light) emitted by the conversion device.

The conversion device 1 includes a carrier body 6, which for example is formed from sapphire and is thus transparent to the primary light 4. It is thus possible to realize the transmissive lighting arrangement illustrated in FIG. 1. In general, a dichroic coating (not illustrated) is additionally situated on the carrier body, said coating transmitting the primary light and reflecting the wavelength-converted light.

The carrier body 6 carries a conversion body 7. Said conversion body is configured here as laminar or disk-shaped. It is secured on the carrier body 6 for example by means of a glass adhesive, i.e. glass as adhesive. The conversion body 7 has a thickness of 30 to 200 μm, for example.

The conversion body 7 is equipped with a safety sensor, which in the present example is essentially realized by a multipathway conduction track 8 extending along the edge of the conversion body 7 in meandering fashion with concentric sections. The sections of the conduction track 8 form almost completely concentric circles and the connecting sections thereof are displaced in a circumferential direction in such a way that any radial crack of the conversion body would sever at least one section of the conduction track 8. In principle, however, other safety sensors in particular having a different geometry of the conduction track are also conceivable for the conversion device 1.

The conduction track 8 constitutes an electrical impedance between its end contacts 9. Said end contacts 9 at the conduction track 8 on the conversion body 7 are electrically connected here to contact elements 10, which enable a robust electrical connection to the measuring instrument 3. The contact elements 10 are planar contact pads, each of which for example occupies approximately 20 to 25 percent of the surface area of the laminar or parallelepipedal carrier body 6. The extent of the contact elements and the shape of the carrier body 6 can of course also be chosen differently.

The electrical connection between the end contacts 9 of the conduction track 8 and the contact elements 10 is realized here in each case by a wire bond connection 11. For this purpose, the respective contact must have a suitable material and a suitable construction. Specifically, the material of the wire of the wire bond connection 11 should be coordinated with the respective material of the contacts 9, 10. Furthermore, the structure of the contacts 9, 10 should also be chosen such that a suitable connection method, for example friction welding, for wire bonding is made possible. In various embodiments, gold wires and corresponding gold contacts are suitable for wire bonding.

The electrical connection between the end contacts 9 and the respective contact elements 10 can also be effected by edge metallization. In this case, a corresponding conductor track is to be brought from an end contact 9 over the edge of the conversion body 7 down onto the carrier body 6 and from there further to the respective contact element 10. By way of example, aluminum is suitable for an edge metallization of this type. The deposition of such a metallization on the conversion body 7 and/or the carrier body 6 can be carried out by sputtering, vapor deposition or the like.

The electrical connection of the contact elements 10 to the measuring instrument 3 can for example also be effected by wire bonding. In various embodiments, the contact elements 10 of the conversion device 1 can be connected to other contacts of a printed circuit board by means of wire bonding, wherein the circuit board can be part of the measuring instrument 3 or at least lead to it.

A wide variety of requirements have to be made of the conduction track 8 and the contact elements 10. A main functionality consists in electrical conduction. The conduction track 8 must furthermore have a defined electrical impedance that should be coordinated with the measuring instrument 3. In this regard, the impedance should lie in a range of 10 to 1000 ohms, e.g. with a mean or median value at 100 ohms. Customary Au layers having a thickness of 1

μm with a line width of 50 μm generally have an excessively low electrical impedance. Therefore, the layer thickness should be smaller. A further requirement made of the conduction track and the contact elements could be electrical insulation. However, there might also be a requirement for the individual contacts to be connected by means of wire bonding as in the example in FIG. 1. This necessitates certain layer thicknesses of the contacts which enable friction welding, for example. A further requirement made of the conduction track 8 and/or the contact elements 10 could be the required adhesion on the carrier body 6 and/or on the conversion body 7. All these requirements generally cannot be satisfied by a single layer.

Various embodiments therefore provide for the conversion device 1 to have a conduction track and at least one contact element, which each consist of a layer construction including a plurality of individual layers. This results in a first layer stack or first layer construction for the contact element 10 and a second layer stack or second layer construction for the conduction track, each including a plurality of individual layers. Each layer includes a different material than a respectively adjoining layer.

The layer stacks or the layer constructions on the carrier body and on the conversion body, i.e. the layer sequences of the contact element and of the conduction track, can be identical. This results in a particularly low coating outlay. However, the layer constructions of contact element and conduction track can also be different. This may be provided e.g. if the contacting between the conduction track 8 and contact element 10 is effected differently than between the contact element 10 and the measuring instrument 3. By way of example, a wire bond connection is effected between the end contact 9 and the contact element 10 and lines to the measuring instrument 3 are soldered onto the respective contact elements 10 or connected via a circuit board, e.g. a flexible circuit board. In this case, the flexible circuit board is connected e.g. by conductive adhesive or by solder on the carrier body (for instance composed of sapphire). The flexible circuit board is then soldered onto a contact pin. On the other hand, an edge metallization could also be effected between the end contact 9 and the contact element 10 and the further contacting to the measuring instrument 3 is carried out via a wire bond connection. Further types of connection and combinations thereof are conceivable.

Individual exemplary layer constructions suitable for the conversion device are illustrated below together with FIGS. 2 to 7.

Figure 2:
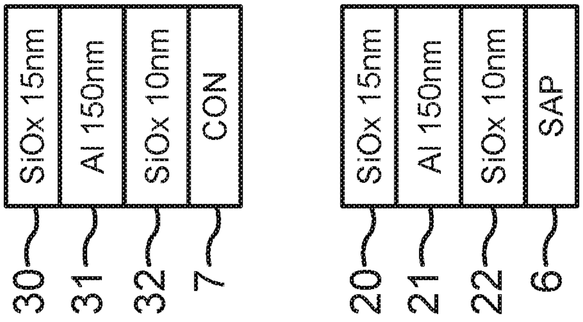
FIGS. 2 to 7 show various layer stacks for conversion devices according to various embodiments.

In accordance with FIG. 2, a contact element 10 has a topmost or first contact layer 20 composed of the electrical insulator SiOx having a layer thickness of 15 nm. Situated directly under that is a second contact layer 21 composed of Al (Al), which is thus electrically conductive, having a thickness of 150 nm. Situated under that in turn is a third contact layer 22 composed of nonconductive SiOx having a thickness of 10 nm. Situated directly under the third contact layer 22 here is the carrier body 6, which is formed from sapphire (SAP) in the present case.

The conversion body 7 (CON) of the conversion device carries the conduction track 8, which here has the same layer construction as the contact element 10. The topmost or first conduction layer 30 here thus also consists of SiOx and has a thickness of 15 nm. Situated directly under that is the second conduction layer 31 composed of Al having a layer thickness of 150 nm. Situated under that in turn is the third conduction layer 32 having a layer thickness of 10 nm. Situated directly under that is the conversion body 7.

The layer thicknesses chosen for the contact element 10 and respectively the conduction track 8 can be varied, of course. One aspect worth mentioning, however, is that the insulation layers are thinner than the conductive Al layer approximately by an order of magnitude. Furthermore, the two layer constructions of conduction track 8 and contact element 10 are particularly suitable for an edge metallization.

Figure 3:
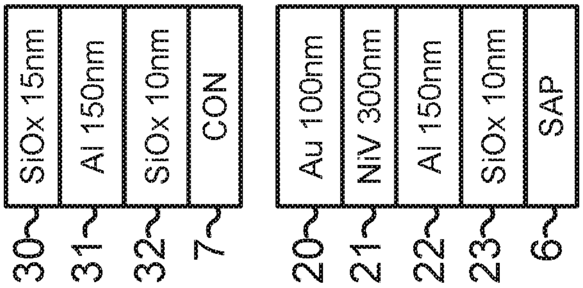

In the example in FIG. 3, the conduction track has the same second layer construction as in the example in FIG. 2. By contrast, the first layer construction of the contact element 10 is chosen differently. The first contact layer 20 consists of Au having a thickness of 100 nm. The second contact layer 21 lying directly under that consists of NiV having a layer thickness of 300 nm. Situated directly under that in turn is the third contact layer 22 composed of Al having a layer thickness of 150 nm. Situated directly under that is a fourth contact layer 23 composed of SiOx with 10 nm. Situated directly under said fourth contact layer 23 is the carrier body 6. This layer construction 20 to 23 of the contact element 10 is bondable. In various embodiments, the Au layer 20 allows bonding with Au wires. In this case, the Au layer can also be restricted laterally e.g. to the region to be bonded. The other layers, too, can, but need not, be restricted individually or jointly laterally with respect to the carrier surface. The underlying second contact layer 21 composed of NiV constitutes a diffusion barrier for the Au atoms.

Figure 4:
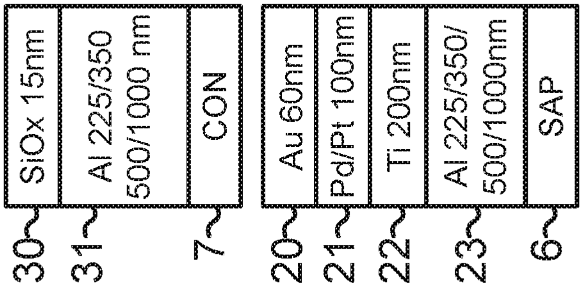

In the example in FIG. 4, the contact element likewise has a first layer construction including four individual layers. The first contact layer consists of Au with 60 nm. The second contact layer 21 lying directly under that can consist of Pd or Pt with 100 nm in each case. The underlying third contact layer 22 consists of Ti with 200 nm. Al having a layer thickness of 225, 350, 500 or 1000 nm, for example, is suitable as fourth contact layer 23. Situated directly under that is the carrier body 6. The second layer construction of the conduction track 8 is chosen differently here. In this regard, although the topmost or first conduction layer 30 also consists of SiOx with 15 nm, the second conduction layer 31, which here lies directly between the first conduction layer 30 and the conversion body 7, here consists of Al having a layer thickness of 225, 350, 500 or 1000 nm. Consequently, at least the Al layer can be applied in a single process step with a corresponding mask both on the carrier body 6 and on the conversion body 7.

Figure 5:
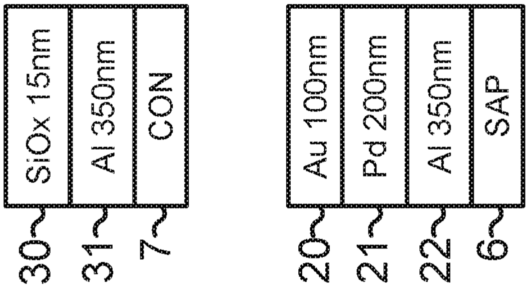

In the example in FIG. 5, the first layer construction of the contact element has a first contact layer 20 composed of Au with 100 nm, under that a second contact layer 21 composed of Pd with 200 nm, and under that a third contact layer 22 composed of Al with 350 nm. The latter is situated directly on the carrier body 6. Said first layer construction is suitable once again for wire bonding. The second layer construction of the conduction track here has a topmost, first conduction layer 30 composed of SiOx with 15 nm and under that a conductive second conduction layer 31 composed of Al with 350 nm. The latter is situated directly on the conversion body 7. Said second layer construction is not suitable for wire bonding, but for edge metallization. In addition, for the end contact 9, for example, a wire bonding pad having the following third layer construction (not shown in FIG. 5) could be used: Au with 200 nm as topmost or first layer, under that NiV with 300 nm as second layer, under that Ti with 60 nm as third layer, and finally under that Al with 500 nm as fourth layer.

Figure 6:
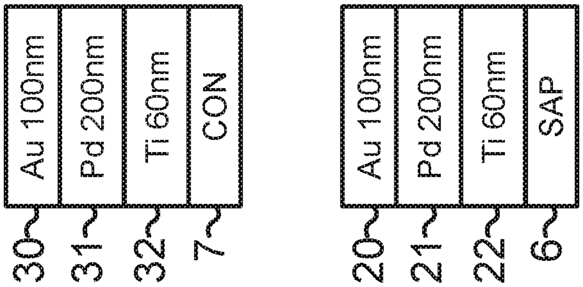

In the example in FIG. 6, the contact element has almost the same layer construction as in the example in FIG. 5. The only exception is that the third contact layer 22 here is composed of Ti rather than of Al and has a layer thickness of 60 nm. The conduction track, by contrast, has a second layer construction suitable for wire bonding. In various embodiments, the first or topmost layer 30 consists of Au with 100 nm. Situated under that is the second conduction layer 32 composed of Pd with 200 nm. Situated directly under that in turn is the third conduction layer 33 composed of Ti with 60 nm. The first layer construction of the contact element thus again corresponds here to the second layer construction of the conduction track, whereby the conversion device can be produced with few coating processes. The gold provides for the electrical conduction and is thin enough that the impedance of the conduction track is suitably high. The Pd in the second layer provides for corresponding elasticity during bonding or friction welding. Ti, by contrast, is used as adhesion promoter to the carrier body and/or conversion body.

Figure 7:
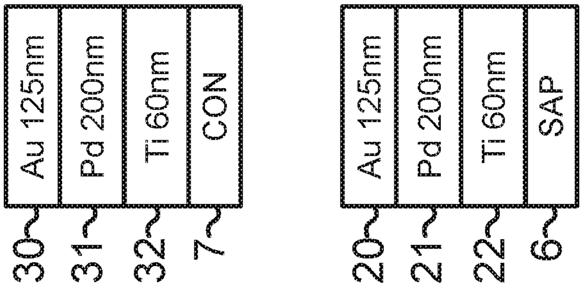

FIG. 7 shows a further embodiment having approximately the same layer constructions as in the example in FIG. 6. The first contact layer 20 and respectively the first conduction layer 30 composed of Au are merely chosen to be somewhat thicker in the example in FIG. 7. The layer thickness is 125 nm.

In principle, the second layer construction of the conduction track can also have a thermistor and, for example, a PTC semiconductor or NTC semiconductor. As a result, the safety sensor can be used not only for monitoring the impedance or a crack of the conversion body but also for monitoring the temperature. Specifically, an NTC thermistor on the basis of doped Si or BaTiO3 or Ba(1-6)Sr(x)TiO3 can be used, for example.

The layer constructions presented above usually include Au or Al as conductive metals. In addition, however, the metals Ni, Pt, Cu or Ta can also be used. With regard to wire bonding, a total layer thickness of 350 to 400 nm should not be undershot. Since the Au layer often used should have a smaller layer thickness, however, on account of the impedance usually demanded, the layer sequences Ti—Ni—V—Au, Al—Ti—NiV—Au, Ti—Pt—Au, ITO-Pd—Au and SiOx-Al-SiOx can also be used besides the layer sequences Ti—Pd—Au and Al—Ti—Pd—Au already presented.

Furthermore, the following conductive metal oxide stacks are also conceivable, however, in order to obtain e.g. transparent or partly transparent constructions: ITO-Pd(Pt)—Au, ITO, ITO-Pd, ITO-Pt and ZnO—Pd(Pt)—Au.

In various embodiments above, Au in the topmost layer and NiV in the second layer were mentioned as diffusion barrier. Alternatively, however, other conductor-nonconductor stacks can also be realized, wherein the nonconductor can serve as diffusion barrier to Au. Such conductor-nonconductor stacks are e.g. TiN—Au, TiW—Au, WTiN—Au, WN—Au, ZrO—Au and Ta2O5-Au. A further layer of Cr, Al, Pd, Pt, Ni, Ti, Cu, Mo, Nb or W can be situated under these stacks.

The abovementioned conversion devices and respectively lighting arrangements can be integrated into the μ-LARP products mentioned in the introduction. In this case, the multifunctional layer stacks can be used for product optimization. In various embodiments, with the use of a semiconductor such as barium titanate, for instance, the nonlinear impedance-temperature characteristic can be exploited in order that operating states at high temperature can be detected even more sensitively.

LIST OF REFERENCE SIGNS

1 Conversion device
2 Light source
3 Measuring instrument
4 Primary light
5 Light
6 Carrier body
7 Conversion body
8 Conduction track
9 End contact
10 Contact element
11 Wire bond connection
20 First contact layer
21 Second contact layer
22 Third contact layer
23 Fourth contact layer
30 First conduction layer
31 Second conduction layer
32 Third conduction layer
33 Fourth conduction layer While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A conversion device, comprising:
a carrier body;
a conversion body, which is secured on the carrier body, for converting electromagnetic radiation;
a conduction track, which is applied on the conversion body, for monitoring the conversion body;
a contact element applied on the carrier body;
wherein the contact element has a first layer construction comprising at least a first contact layer and a second contact layer comprising mutually different materials;
wherein the conduction track has a second layer construction comprising at least a first conduction layer and a second conduction layer comprising mutually different materials;
wherein the contact element is electrically connected to the conduction track; and
wherein at least one of the first conduction layer or the second conduction layer are electrically conductive and the thickness of said conductive layers is chosen such that an electrical impedance of the conduction track lies in a predetermined range.

2. The conversion device of claim 1,
wherein all the layers of the layer constructions in each case have a constant layer thickness which is a maximum of 1000 nm.

3. The conversion device of claim 1,
wherein the first layer construction of the contact element has a third contact layer comprising a different material than the second contact layer, thus resulting in the layer sequence of first, second and third contact layers.

4. The conversion device of claim 1,
wherein the second layer construction of the conduction track has a third conduction layer comprising a different material than the second conduction layer, thus resulting in the layer sequence of first, second and third conduction layers.

5. The conversion device of claim 1,
wherein at least one of the first contact layer or the first conduction layer consist of silicon oxide.

6. The conversion device of claim 1,
wherein at least one of the second contact layer or the second conduction layer are predominantly formed from one of the elements Ni, Pt, Cu, Ta or Al.

7. The conversion device of claim 3,
wherein at least one of the third contact layer or the third conduction layer consist of silicon oxide.

8. The conversion device of claim 1,
wherein at least one of the first contact layer or the first conduction layer predominantly comprise Au.

9. The conversion device of claim 1,
wherein at least one of the second contact layer or the second conduction layer predominantly comprise one of the elements Pt, Pd, Ni or V.

10. The conversion device of claim 3,
wherein at least one of the first contact layer or the first conduction layer predominantly comprise Au; and
wherein at least one of the third contact layer or the third conduction layer comprise one of the elements Ti or Al.

11. The conversion device of claim 10,
wherein at least one of the third contact layer or the third conduction layer have a thickness in the range of 50 to 100 nm.

12. The conversion device of claim 1,
wherein the carrier body is transparent at least to the electromagnetic radiation to be converted.

13. The conversion device of claim 1,
wherein at least one of the first or second layer construction have a diffusion barrier with respect to Au.

14. The conversion device of claim 13,
wherein the diffusion barrier includes the elements Cr, Al, Pd, Pt, Ni, Cu, Mo, Nb or W and has a thickness in the range of 100 to 500 nm.

15. The conversion device of claim 1,
wherein the predetermined range for the electrical impedance contains the value of 100 ohms in particular as mean value.

16. The conversion device of claim 1,
wherein the conduction track has a thermistor.

17. The conversion device of claim 1,
wherein a layer of at least one of the contact element or of the conduction track is transparent at least to the electromagnetic radiation to be converted.

18. The conversion device of claim 1,
wherein the electrical impedance has a resistive portion, an inductive portion or a capacitive portion.

19. A measuring instrument, comprising:
a conversion device, comprising:
a carrier body;
a conversion body, which is secured on the carrier body, for converting electromagnetic radiation;
a conduction track, which is applied on the conversion body, for monitoring the conversion body;
a contact element applied on the carrier body;
wherein the contact element has a first layer construction comprising at least a first contact layer and a second contact layer comprising mutually different materials;
wherein the conduction track has a second layer construction comprising at least a first conduction layer and a second conduction layer comprising mutually different materials;
wherein the contact element is electrically connected to the conduction track; and
wherein at least one of the first conduction layer or the second conduction layer are electrically conductive and the thickness of said conductive layers is chosen such that an electrical impedance of the conduction track lies in a predetermined range;
wherein the electrical impedance of the conduction track is adapted to the measuring instrument.

20. A lighting arrangement, comprising:
a measuring instrument comprising a conversion device, the conversion device comprising:
a carrier body;
a conversion body, which is secured on the carrier body, for converting electromagnetic radiation;
a conduction track, which is applied on the conversion body, for monitoring the conversion body;
a contact element applied on the carrier body;
wherein the contact element has a first layer construction comprising at least a first contact layer and a second contact layer comprising mutually different materials;
wherein the conduction track has a second layer construction comprising at least a first conduction layer and a second conduction layer comprising mutually different materials;
wherein the contact element is electrically connected to the conduction track; and
wherein at least one of the first conduction layer or the second conduction layer are electrically conductive and the thickness of said conductive layers is chosen such that an electrical impedance of the conduction track lies in a predetermined range;
and a light source for illuminating the conversion device.

* * * * *